(12) United States Patent
Huang et al.

(10) Patent No.: US 10,379,188 B2
(45) Date of Patent: Aug. 13, 2019

(54) MRI USING SPATIALLY ADAPTIVE REGULARIZATION FOR IMAGE RECONSTRUCTION

(71) Applicant: KONINKLIJKE PHILIPS N.V., Eindhoven (NL)

(72) Inventors: Feng Huang, Eindhoven (NL); Enhao Gong, Eindhoven (NL)

(73) Assignee: KONINLIJKE PHILIPS N.V., Eindhoven (NL)

( * ) Notice: Subject to any disclaimer, the term of this patent is extended or adjusted under 35 U.S.C. 154(b) by 606 days.

(21) Appl. No.: 14/916,200

(22) PCT Filed: Aug. 27, 2014

(86) PCT No.: PCT/IB2014/064089
§ 371 (c)(1),
(2) Date: Mar. 3, 2016

(87) PCT Pub. No.: WO2015/033250
PCT Pub. Date: Mar. 12, 2015

(65) Prior Publication Data
US 2016/0195597 A1     Jul. 7, 2016

Related U.S. Application Data

(60) Provisional application No. 61/873,949, filed on Sep. 5, 2013.

(51) Int. Cl.
*G01R 33/561* (2006.01)
*G01R 33/50* (2006.01)
(Continued)

(52) U.S. Cl.
CPC ......... *G01R 33/5615* (2013.01); *G01R 33/50* (2013.01); *G01R 33/5608* (2013.01); *G01R 33/5611* (2013.01); *G01R 33/56554* (2013.01)

(58) Field of Classification Search
USPC ................. 324/300–322; 600/407–435; 382/128–131
See application file for complete search history.

(56) References Cited

U.S. PATENT DOCUMENTS

7,592,809 B1    9/2009  King et al.
2004/0207402 A1  10/2004  Kellman et al.
(Continued)

FOREIGN PATENT DOCUMENTS

WO    20120127341 A1    9/2012

OTHER PUBLICATIONS

Wenchuan Wu et al., Highly accelerated multi-contrast carotid imaging using sharable information, 21 Proc. Int'l Soc. Mag. Res. in Med. 4533 (Apr. 6, 2013).*

(Continued)

*Primary Examiner* — Tung X Nguyen
*Assistant Examiner* — Robert P Alejnikov, Jr.

(57) ABSTRACT

A magnetic resonance (MR) imaging system may include at least one controller which may acquire echo information of a region of interest (ROI). The echo information may include first image information suitable for reconstructing at least part of a first image at a selected contrast. The MR imaging system can obtain previously-reconstructed image information of one or more previously-reconstructed images having a contrast different than the selected contrast; extract information from the previously-reconstructed image information; determine spatially adaptive regularization weights for regularized reconstruction based upon the extracted information; and/or reconstruct the first image in formation in accordance with the spatially adaptive regularization weights and the echo information.

18 Claims, 9 Drawing Sheets

(51) Int. Cl.
*G01R 33/56* (2006.01)
*G01R 33/565* (2006.01)

(56) References Cited

U.S. PATENT DOCUMENTS

| | | | | |
|---|---|---|---|---|
| 2013/0216113 A1* | 8/2013 | O'Connor | ............... | A61B 6/482 382/128 |
| 2014/0270453 A1* | 9/2014 | Guo | ........................ | G06T 5/002 382/131 |
| 2015/0073258 A1* | 3/2015 | Mazer | .................... | G01R 33/50 600/410 |

OTHER PUBLICATIONS

Enhao Gong et al., PROMISE: Parallel Reconstruction with Optimized acquisition for Multi-contrast Imagine in the context of compressed Sensing, 21 Proc. Int'l Soc. Mag. Res. in Med. 2610 (Apr. 6, 2013).*

Wu W et al: "Highly accelerated multi-contrast carotid imaging using sharable information", Proceedings of the International Society for Magnetic Resonance in Medicine, 21st Annual Meeting and Exhibition, Salt Lake City, Utah, USA, Apr. 20-26, 2013, vol. 21, Apr. 6, 2013 (Apr. 6, 2013), p. 4533.

Gong E et al: "PROMISE: Parallel,Reconstruction with Optimized acquisition, for Multi-contrast Imaging in the context of compressed Sensing",Proceedings of the International Society For Magnetic Resonance in Medicine, 21st Annual Meeting and Exhibition, Salt Lake City, Utah, USA, Apr. 20-26, 2013,vol. 21 , Apr. 6, 2013 (Apr. 6, 2013), p. 2610.

Berkin Bilgic et al:"Multi-contrast reconstruction with Bayesian compressed sensing", Magnetic Resonance in Medicine,vol. 66 , No. 6, Jun. 10, 2011 (Jun. 10, 2011), pp. 1601-1615.

Yu Li et al: "Correlation imaging for ultiscan MRI with parallel data acquisition",Magnetic Resonance in Medicine, vol. 68, No. 6, Feb. 28, 2012 (Feb. 28, 2012), pp. 2005-2017.

Feng Huang et al: "MRI Using Sharable Information Among Images With Different Contrasts: Motion Compensation",Proceedings of the International Society for Magnetic Resonance in Medicine, 20 th Annual Meeting and Exhibition, Melbourne,Australia, May 5-11, 2012,vol. 20, Apr. 21, 2012 (Apr. 21, 2012), p. 3435.

W Guo et al: "Local Mutual information guidied denoising for self-calibrated-10,PPI" Proceedings of the International Society for Magnetic Resonance in Medicine, 16thAnnual Meeting and Exhibition, Toronto,Canada, May 3-9, 2008,vol. 16, Apr. 19, 2008 (Apr. 19, 2008), p. 1289.

Viehmet Akçakaya et al:"Accelerated 1-3,contrast-enhanced whole-heart coronary MRI 5-10,using low-dimensional-structure self-learning and thresholding".Magnetic Resonance in Medicine, vol. 67, No. 5, Mar. 5, 2012 (Mar. 5, 2012),pp. 1434-1443.

Philip M. Robson et al: "Comprehensive,quantification of signal-to-noise ratio,and g-factor for image-based and k-space-based parallel imaging18,19reconstructions",Magnetic Resonance in Medicine, vol. 60, No. 4, Sep. 24, 2008 (Sep. 24, 2008), pp. 895-907.

Bilgic B, Goyal VK, Adalsteinsson E., entitled "Multi-Contrast Reconstruction with Bayesian Compressed Sensing." MagnReson Med 2011;66(6):1601-1615.

Li Y, Dumoulin C., entitled "Correlation Imaging for Multiscan MRI with Parallel Data Acquisition." MagnReson Med 2012.

Huang F, Lin W, Harder Cd, Beck G, Boss C, Duensing GR, Reykowski A., entitled "MRI Using Sharable Information Among Images With Different Contrasts: Motion Compensation." 2012; Melbourne, Australia. p. 3435.

Huang F, Chen Y, Yin W, Lin W, Ye X, Guo W, Reykowski A., entitled "A Rapid and Robust Method for Sensitivity Encoding with Sparsity Constraints: Self-feeding Sparse SENSE". MagnReson Med 2010;64(4):1078-1088.

Guo W, Huang F., entitled "Local Mutual Information Guided Denoising for Self-Calibrated PPI." 2008; Toronto. p. 1289.

Akcakaya M, Basha TA, Chan RH, Rayatzadeh H, Kissinger KV, Goddu B, Goepfert LA, Manning WJ, Nezafat R., entitled "Accelerated Contrast-Enhanced Whole-Heart Coronary MRI Using Low-Dimensional-Structure Self-Learning and Thresholding." MagnReson Med 2012; 67(5):1434-1443.

Crouse M, Nowak R, Baraniuk R., entitled "Wavelet-Based Statistical Signal Processing Using Hidden Markov Models. IEEE Trans Signal Processing." 1998; 46(4):886-902.

Duarte M, Wakin M, Baraniuk R., entitled "Wavelet-Domain Compressive Signal Reconstruction Using a Hidden Markov Tree Model." IEEE ICAASP; 2008.p. 5137-5140.

Guo W, Huang F., entitled "Adaptive Total Variation Based Filtering for MRI Images with Spatially Inhomogeneous Noise and Artifacts." 2009; Boston, USA. p. 101-104.

Robson PM, Grant AK, Madhuranthakam AJ, Lattanzi R, Sodickson DK, McKenzie CA., entitled "Comprehensive Quantification of Signal-to-Noise Ratio and g-Factor for Image-Based and k-Space-Based Parallel Imaging Reconstructions." MagnReson Med 2008;60:895-907.

Pruessmann KP, Weiger M, Scheidegger MB, Boesiger P., entitled "SENSE: Sensitivity encoding for fast MRI. MagnReson." Med 1999; 42:952-962.

* cited by examiner

MRI USING SPATIALLY ADAPTIVE REGULARIZATION FOR IMAGE RECONSTRUCTION

CROSS REFERENCE TO RELATED APPLICATIONS

This application is a U.S. national phase application of International Application No. PCT/IB2014/064089, filed on Aug. 27, 2014 which claims the benefit of U.S. Provisional Patent Application Ser. No. 61/873,949 filed on Sep. 5, 2013 and is incorporated herein by reference.

The present system relates to a medical imaging system for reconstructing images using spatially adaptive regularization techniques and, more particularly, to a regularized parallel imaging system which uses structure and noise distribution information of one or more reconstructed images to at least partially acquire another image.

Fast-imaging techniques are essential for obtaining high-quality images at low-cost. Unfortunately, conventional fast-imaging techniques may not obtain sufficient detail for reconstructing images. Accordingly, there has been interest in exploiting the sharable information among images with different contrasts for fast imaging (e.g., R1-R3). For example, one conventional scheme (e.g., R1), uses sharable structure information to enhance compressed sensing at the cost of an extremely high computational burden and is sensitive to inter-scan motion. Further, a correlation imaging method (e.g., R2) discusses using shared coil sensitivity information and is not believed to be functional when there is inter-scan motion. Unfortunately, fast-imaging techniques typically provide information which may be insufficient to reconstruct an image with sufficient image characteristics such as clarity, detail, etc. Others, such as described in, WO/2012/127341 (also listed as Reference R12 at the end of the present Specification), the contents of which are incorporated by reference herein, use sharable Region of Interest (ROI) or mutual information among different contrast images as a constraint in a regularization term. This method could also be sensitive to large scale inter-scan motion.

Compared to known methods, embodiments of the present system include the following benefits: 1) besides structure information, noise distribution due to partial acquisition may be shared; and 2) the shared information is not directly used in a regularization term to enforce the similarity. Instead, the shared information may be used to define a spatially adaptive regularization parameter of the regularization term. In this way, the proposed reconstruction method may be less sensitive to motion. The following equations provide examples and may be used by embodiments of the present system.

Equation (1) below shows a conventional reconstruction method $$\min_x E(x) = \|Dx - k\|_2^2 + \lambda_0 \|Gx - x\|_2^2 + \lambda_1 \|\Psi(F^{-1}x)\|_1 + \lambda_2 \|\nabla(F^{-1}x)\|_1 \quad \text{Eq. (1)}$$

where x is the reconstructed k-space of all channels, k is the partially acquired data, D is the operator for data undersampling, G is a general convolution operator for Self-consistent Parallel Imaging Reconstruction (SPIRiT), Ψ is the wavelet transform and ∇ is the gradient operator. The non-negative regularization parameters, $\lambda_0$, $\lambda_1$ and $\lambda_2$, balance these four terms. The last two terms are sparsity constraints; they enforce the sparsity of the reconstructed image in these transformed domains. In Equation (1), two sparsity constraints are used as an example. Equation (1) shows one conventional method without using any sharable information.

Another method described in WO/2012/127341 uses prior information in the regularization term as shown in Equation (2)

$$\min_x E(x) = \|Dx - k\|_2^2 + \lambda_0 \|Gx - x\|_2^2 + \lambda_1 \|Mx\|_2^2 + \lambda_2 \|\nabla(F^{-1}x)\|_1 \quad \text{Eq. (2)}$$

where M is the shared ROI information.

Equation (3) below illustrates a reconstruction method in accordance with embodiments of the present system.

$$\min_x E(x) = \|Dx - k\|_2^2 + \lambda_0 \|Gx - x\|_2^2 + \quad \text{Eq. (3)}$$
$$\lambda_1 N W_n \|\Psi(F^{-1}x)\|_1 + \lambda_2 N W_l \|\nabla(F^{-1}x)\|_1$$

where N is decided by the shared noise distribution. Noise distribution information can be calculated by artificially undersampling the reconstructed previous image, and then reconstructing the image again with the artificially undersampled data. $W_n$ and $W_l$ are spatially adaptive weights defined by the shared structure information. As an example, the weights $W_n$ and $W_l$ are defined by a set of point-wise weighting functions.

$$W_n = (p_n + \delta)^{-q} 1 \le W_n \le \delta^{-q}$$

$$W_l = (p_l + \delta)^{-q}, \; 1 \le W_l \le \delta^{-q} \quad \text{Eq. (4)}$$

$P_n$ and $P_l$ are the statistical probabilities of being boundaries in wavelet and image space, which are computed using Equation (3). The parameter δ is for overflow prevention; and parameter q is for controlling the order of regularization. Compared to Equation (2), it can be seen that the shared information is used in a different approach. FIGS. 6-8 show that the embodiments of the present system are less sensitive to inter-scan motion than conventional methods, due to the usage of shared information in a regularization parameter. Further, in accordance with embodiments of the present system: 1) If the data set has more than 2 images, the process may enhance the sharable information after the reconstruction of the second image. The enhanced information can reconstruct the $3^{rd}$ and the following images better; and 2) After the reconstruction of the second image, the enhanced boundary information can also be used to improve the reconstruction of the first image.

Further, when an acceleration factor is high, a partially parallel imaging (PPI) technique tends to reduce signal-to-noise ratio (SNR) and produce residual aliasing artifacts. Although a regularized reconstruction technique, such as compressed sensing (CS) method, can preserve SNRs, this technique does so at the cost of blurred boundaries. Although methods of using spatially adaptive weights using noise distribution (e.g., g-factor) information (e.g., R4) or using detected boundary information (e.g., R5 and R6) have been proposed, these methods are not easy to perform. For example, for trajectories with irregular patterns, the prediction of g-factor is difficult to obtain. Moreover, a self-learning technique for boundary detection with partially acquired data has to be iterative or inaccurate since the initial reconstruction with partially acquired data is imperfect.

Embodiments of the present system use the previously reconstructed image for boundary detection. Hence the detected boundary can be more accurate.

The system(s), device(s), method(s), user interface(s), computer program(s), processes, etc. (hereinafter each of which will be referred to as system, unless the context indicates otherwise), described herein address problems in prior art systems.

In accordance with embodiments of the present system, there are disclosed methods which incorporate a combination of partially parallel imaging (PPI) and regularization to compensate the drawbacks of conventional imaging methods. Embodiments of the present system provide methods to select parameters to balance PPI and regularization for image reconstruction. More particularly, embodiments of the present system may provide methods to define spatially adaptive weights in regularized PPI to balance noise and artifact levels when reconstructing images such as magnetic resonance (MR) images and the like.

In accordance with embodiments of the present system, there is disclosed a magnetic resonance (MR) imaging system which may include at least one controller which may acquire echo information of a region of interest (ROI), the echo information including first image information suitable for reconstructing at least part of a first image at a selected contrast; obtain previously-reconstructed image information of one or more previously-reconstructed images having a contrast different than the selected contrast; extract information from the previously-reconstructed image information; determine spatially adaptive regularization weights for regularized reconstruction based upon the extracted information; and/or reconstruct the first image information in accordance with the spatially adaptive regularization weights and the echo information.

It is also envisioned that the at least one controller may reconstruct the first image information in accordance with a regularized reconstruction method. Further, the information extracted from the previously-reconstructed image information may include at least one of structure and noise information. Moreover, it is envisioned that the at least one controller may select the first image information from one of T1w or T2w image resolutions, and selects the previously reconstructed image information from the other of the T1w or T2 image resolutions. However, T1w and T2w sets are only one example. Further embodiments may include other image sets, each image set including at least two images. For example in some embodiments, sets may include a set of diffusion weighted images, a set of images for T1 or T2 mapping, a set of images for susceptibility weighted imaging, etc. In yet other embodiments, image sets that share the same field-of-view (FOV), but have different contrast or other image parameters such as resolution may be used. Thus, the first image information may be selected from one of first or second data sets of first or second image information, respectively, and may select the previously reconstructed image information from the other of the first or second data sets wherein the first and second image information have the same field-of view (FOV). However, the first and second image information may correspond with different image parameters such as contrasts, resolution, etc.

Moreover, the first image information may include a partially acquired data set. It is also envisioned that the MR imaging system may include a display, wherein the at least one controller may render on the display at least one of the reconstructed first image information at the selected contrast and the previously-reconstructed image information having a contrast different from the selected contrast.

In accordance with yet other embodiments of the present system, there is disclosed a method of reconstructing images from magnetic resonance (MR) image information obtained by an MR imaging system, the method may be performed by at least one controller of the MR imaging system and may include one or more acts of: acquiring echo information of a region of interest (ROI), the echo information suitable for reconstructing at least part of a first image at a selected contrast; obtain previously-reconstructed image information of one or more previously-reconstructed images having a contrast different from the selected contrast; extracting information from the previously-reconstructed image information; determining spatially adaptive regularization weights based upon the extracted information; and reconstructing the first image information in accordance with the spatially adaptive regularization weights and the echo information.

It is also envisioned the act of reconstructing the first image information may be performed in accordance with a regularized reconstruction method. Further, the act of extracting information from the previously-reconstructed image information may further include an act of extracting at least one of structure information and noise information from the previously-reconstructed image information. Moreover, then method may further include one or more acts of: selecting the first image information from one of T1w or T2w image resolutions; and selecting the previously reconstructed image from the other of the T1w or T2w image resolutions. In accordance with embodiments of the method, the first image information may include a partially acquired data set which may be insufficient to reconstruct an image at sufficient detail or other characteristic. The method may further include an act of rendering, on the display, at least one of the reconstructed first image information at the selected contrast and the previously-reconstructed image information at a contrast different from the selected contrast.

In accordance with yet further embodiments of the present system, there is disclosed a computer program stored on a computer readable memory medium, the computer program may be configured to reconstruct images from magnetic resonance (MR) image information, the computer program may include a program portion configured to: acquire echo information of a region of interest (ROI), the echo information suitable for reconstructing at least part of a first image at a selected contrast; obtain previously-reconstructed image information of one or more previously-reconstructed images having a contrast different from the selected contrast; extract information from the previously-reconstructed image information; determine spatially adaptive regularization weights for regularized reconstruction and are based upon the extracted image information; and/or reconstruct the first image information in accordance with the spatially adaptive regularization weights and the echo information.

It is also envisioned that the program portion is may be further configured to reconstruct the first image information in accordance with a regularized reconstruction method. Moreover, it is envisioned that to extract information from the previously-reconstructed image information the program portion may be further configured to extract at least one of structure information and noise information from the previously-reconstructed image information. Further, the program portion may be further configured to select the first image information from one of T1w or T2w image resolutions, and select the previously reconstructed image from the other of the T1w or T2w image resolutions. Moreover, when acquiring the echo information of ROI, the portion may be further configured to acquire only a partial data set. It is also envisioned that the program portion may be further configured to render, on a display, at least one of the reconstructed first image information at the selected contrast and the previously-reconstructed image information having a contrast different than the selected contrast.

The invention is explained in further detail, and by way of example, with reference to the accompanying drawings wherein.

Figure 8:
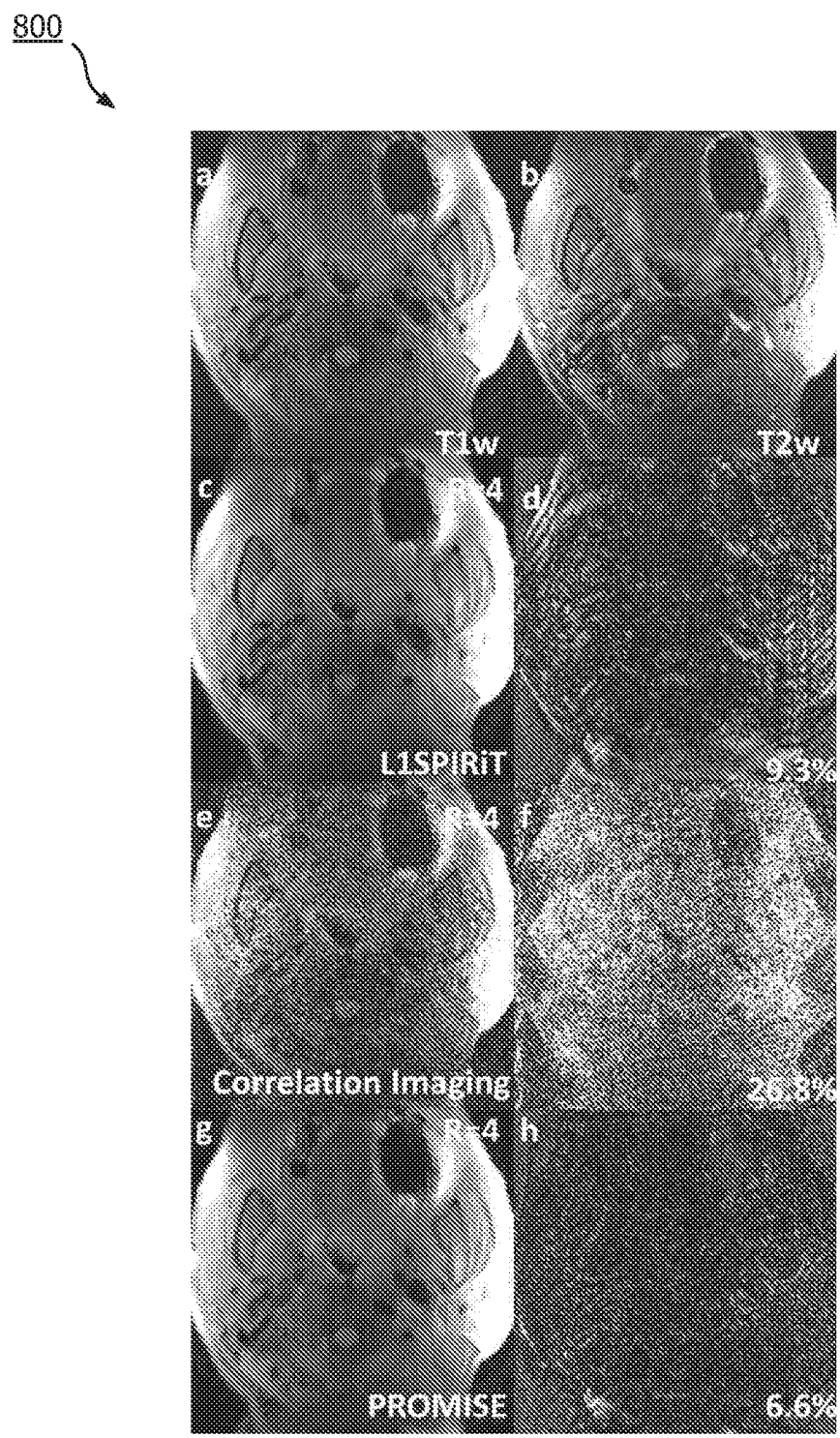
Figure 9:
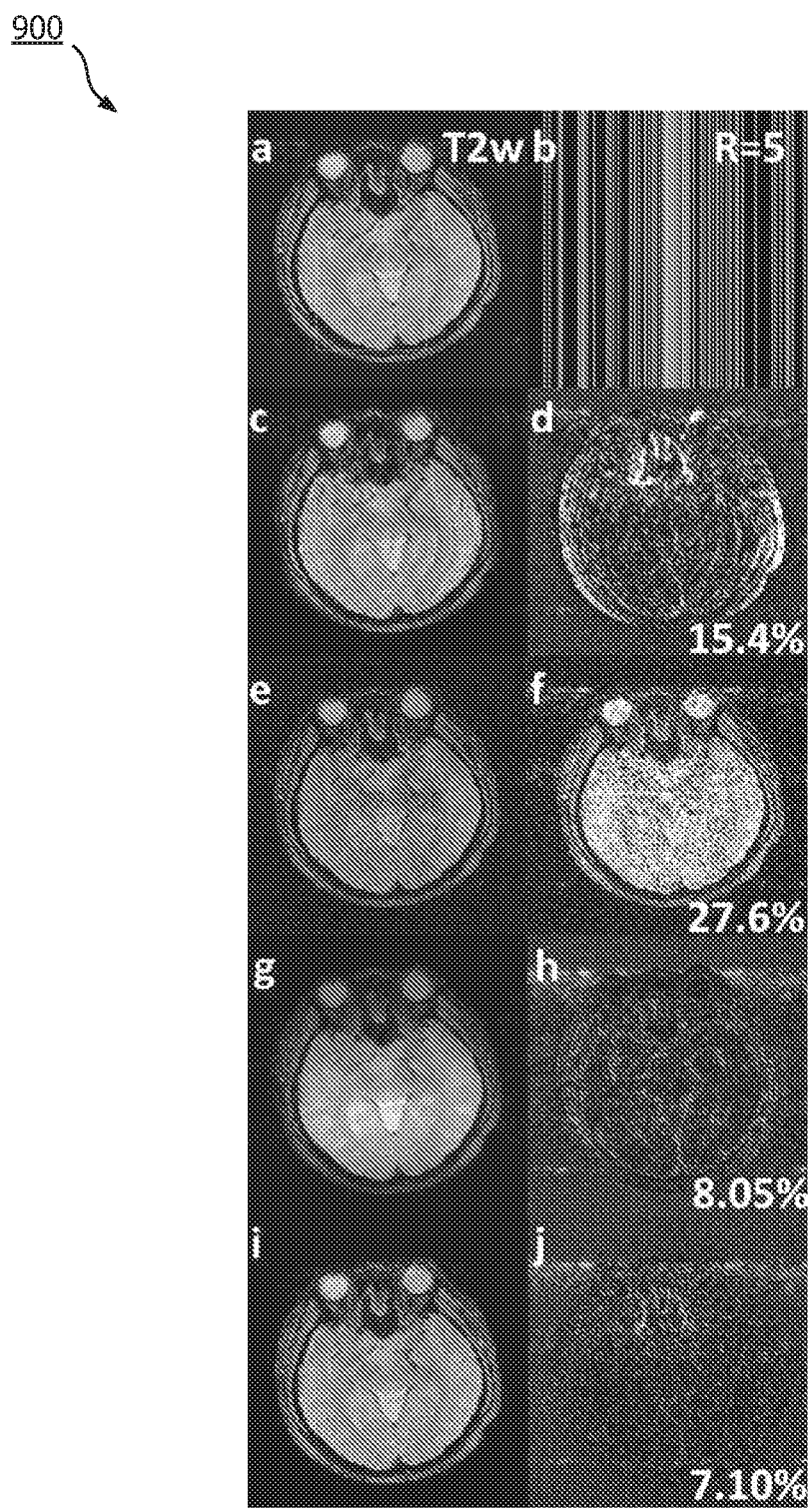

FIG. 8 shows a graph of a series of images illustrating comparison of sensitivity to non-rigid inter-scan motion of a data set in accordance with embodiments of the present system; and FIG. 9 shows a graph of a series of images illustrating comparison of images obtained by conventional systems and in accordance with embodiments of the present system which is less sensitive to inter-scan motion due to the usage of shared information in regularization parameter and thus provides superior images.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques and methods are omitted so as not to obscure the description of the present system. It should be expressly understood that the drawings are included for illustrative purposes and do not represent the entire scope of the present system. In the accompanying drawings, like reference numbers in different drawings may designate similar elements.

Figure 1A:
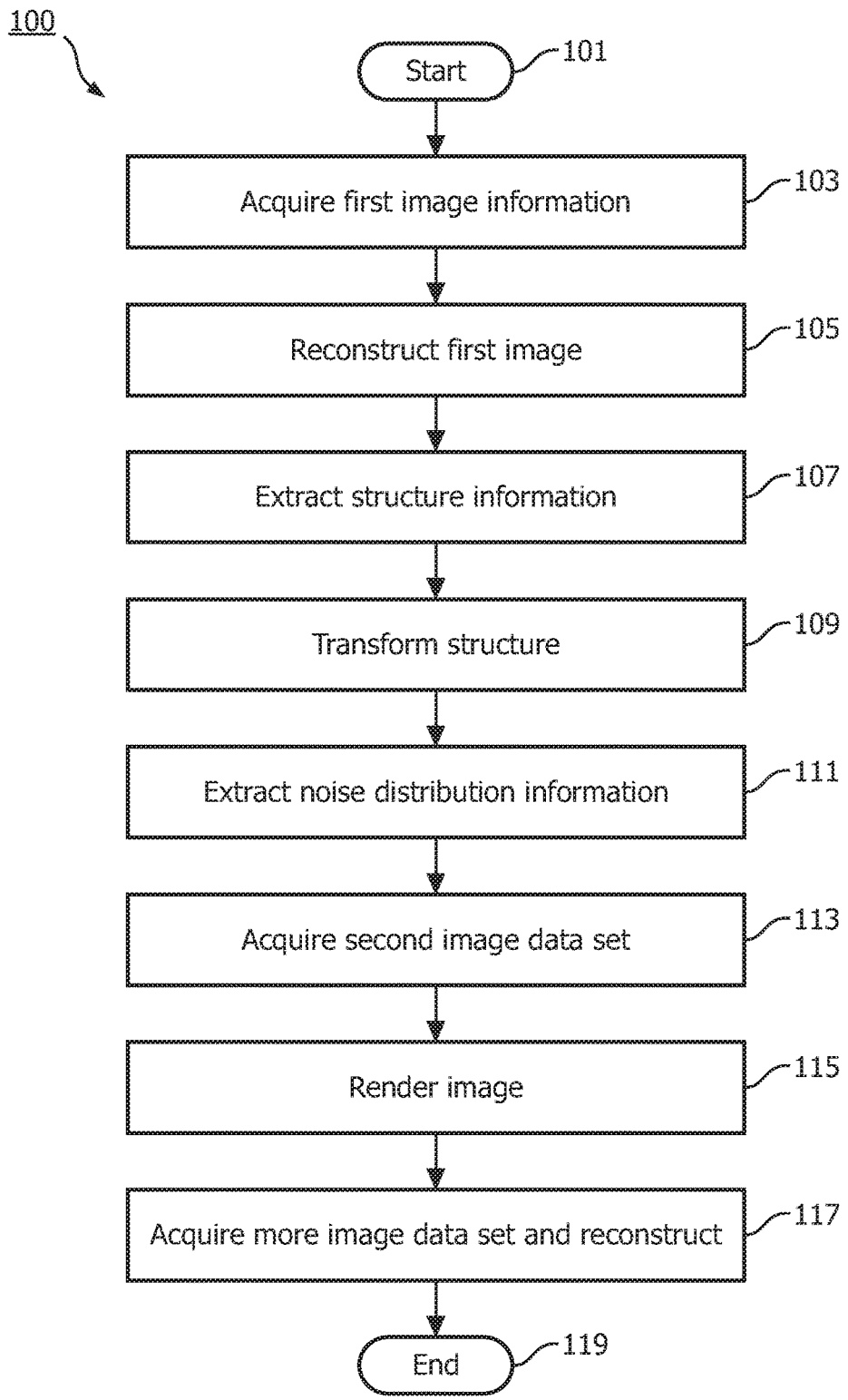
FIG. 1A is a flow diagram that illustrates a process performed on an imaging system in accordance with one embodiment of the present system.

FIG. 1A is a flow diagram that illustrates a process 100 performed by an imaging system in accordance with embodiments of the present system. The process 100 may be performed using one or more computers communicating over a network and may obtain information from, and/or store information to one or more memories which may be local and/or remote from each other. The process 100 can include one of more of the following acts. Further, one or more of these acts may be combined and/or separated into sub-acts, if desired. Further, one or more of these acts may be skipped depending upon settings. The image information may include, for example, k-space image information. In operation, the process may start during act 101 and then proceed to act 103.

During act 103, the process may acquire first image information such as a T1w image scan (R=1~2), which information may be used to at least partially reconstruct one or more images at a first contrast (e.g., a selected contrast) such as a T2W image. The first image information may be acquired in, for example, real time using any suitable medical imaging method or methods such as MR imaging methods. Accordingly, the image information may include echo information obtained of a region of interest (ROI) using an MR imaging method. The first image information may be referred to as partially or fully acquired data. After completing act 103, the process may continue to act 105.

During act 105, the process may acquire at least one previously reconstructed image data set of one or more images having a contrast which is different than the first contrast. The at least one previously reconstructed image data set may be referred to as a second image data set and in the present exemplary embodiments, may have a contrast (e.g., T1w) that is different from a contrast of the first image information. Accordingly, the process may determine a contrast setting of the first image information (e.g., T2w) and thereafter determine a contrast for the second image data set which is different from the determined contrast of the first image information (e.g., T1w). Corresponding image data sets that share the same or substantially similar field-of-view (FOV) can use the scheme. The selection of the first and second contrast can be based on, but not limited to, the speed of acquisition, the resolution level and imaging requirement.

Figure 4:
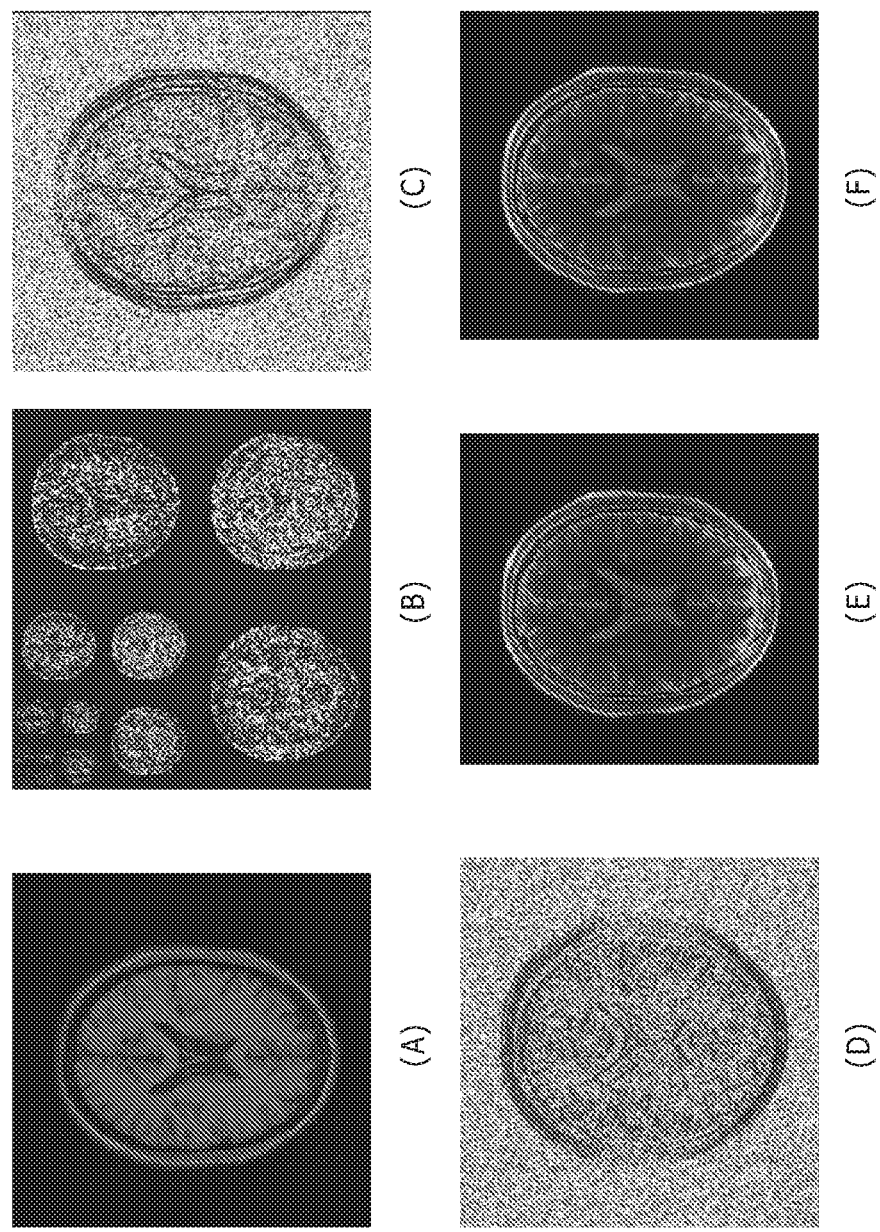
FIG. 4 shows exemplary images formed in accordance with embodiments of the present system.

In some embodiments, it is envisioned that the second image data set may or may not have the same resolution as the current data set. In addition, small mis-registration due to rigid/non-rigid motion may be acceptable. Experimentally, based on error level of the reconstructed second image, embodiments of the present system have been determined to tolerate in-plane inter-scan motions with up to 9 mm translation and 20° rotation. However, other inter-scan motion and translation values are also envisioned. Thus, the ROI of the second image data set may be slightly different from the ROI of the first image information. However, the FOV of the second image data set should be substantially similar to the FOV of the first image information. The second image data set may be obtained from any suitable source such as from an image acquisition device (e.g., the MR imaging system) and/or from a memory of the system. In the present embodiments, it will be assumed that the second image information may include at least one previously reconstructed or acquired image data set of a second (e.g., a different) contrast type than the contrast of the first image information such as a T1W image as shown in image (a) of FIG. 4 which shows exemplary images formed in accordance with embodiments of the present system. However, in yet other embodiments, it is envisioned that the second/previous image data set may have the same contrast as the first/current image data set. After completing act 105, the process may continue to act 107.

During act 107, the process may extract structure information from the second image data set. Accordingly, the process may do this using any suitable method and may be operative in any suitable domain such as a transformed wavelet domain, an image domain, etc. For example, in the present embodiment, a wavelet domain model will be described. Accordingly, the process may employ a Hidden Markov Tree (HMT) Model (e.g., see, R7-R8) with scale-dependent parameters to capture the structure in wavelet domain statistically using the T1w image of the second image information.

Briefly, MRI images have sparse wavelet expansions and significant wavelet coefficients and exhibit properties that can be modeled using a wavelet quad-tree. These properties are (a) a Persistence Property: significance persists across the scales; (b) Scale-Dependence: persistence becomes stronger finer scale; and (c) Decaying Magnitudes: magnitude drops exponentially to finer scale. Accordingly, in the HMT Model, the HMT model parameters may capture these properties in a wavelet domain. The transform from a mother state to a daughter state may capture the persistence of significance; the transform rate is scale-dependence; and the value level of significant wavelet component is decaying from coarser to finer scale. In accordance with the embodiments of the present system, these parameters may be estimated based on the information including, but not limited to, wavelet component information from the reconstructed image. It should be noted that a wavelet domain structure cannot be defined just by values since they obey mixture distribution and threshing cannot differentiate noise with small but important signal. Thus, statistical methods and models as described below are required and may be employed by embodiments of the present system.

Figure 1B:
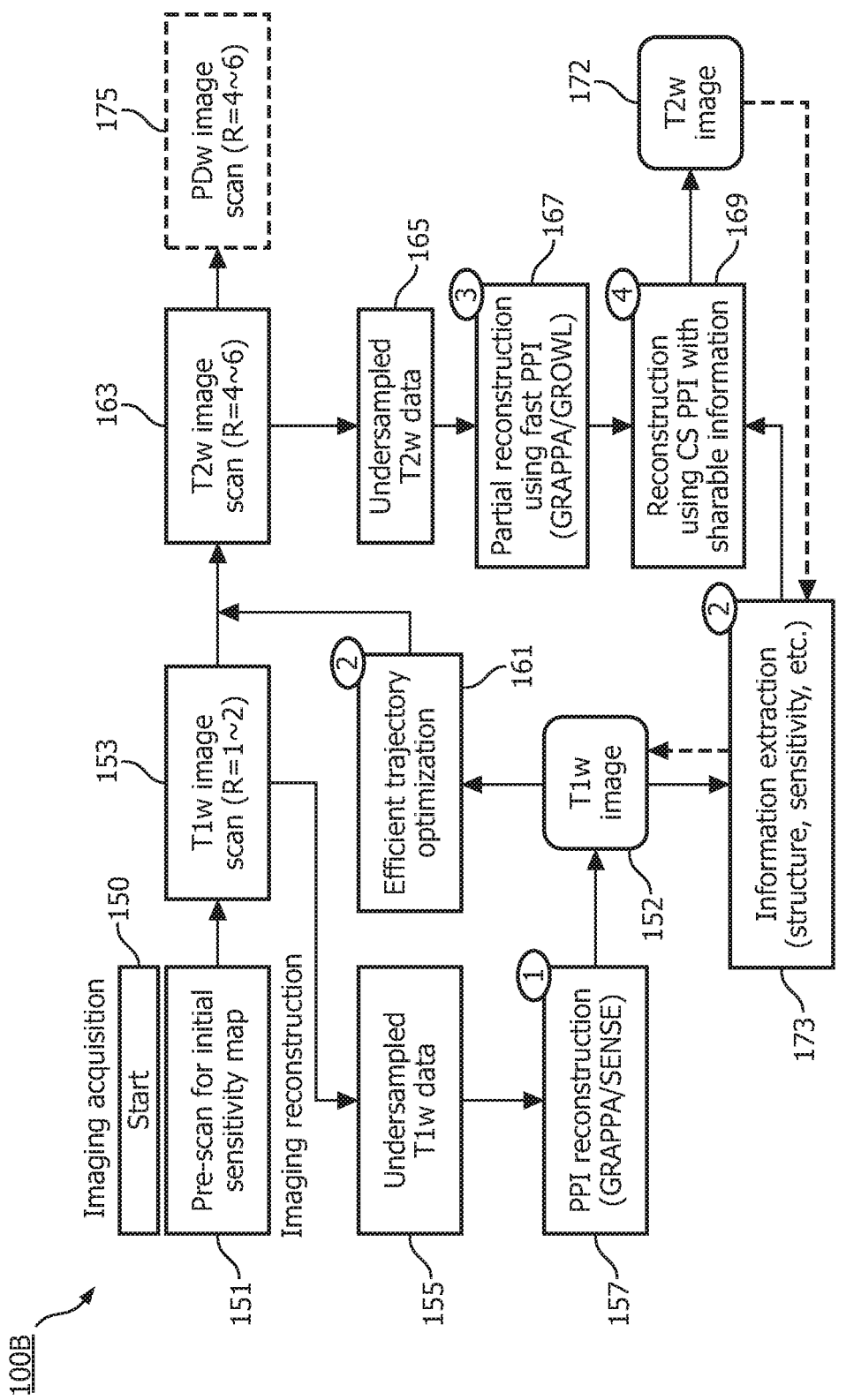
FIG. 1B is a flow diagram that illustrates a process performed on an imaging system in accordance with a specific example of an embodiment of the present system.

FIG. 1B is a flow diagram that illustrates a process 100B performed by an imaging system in accordance with embodiments of the present system. The process 100B may be performed using one or more computers communicating over a network and may obtain information from, and/or store information to one or more memories which may be local and/or remote from each other. The process 100B can include one of more of the following acts. Further, one or more of these acts may be combined and/or separated into sub-acts, if desired. Further, one or more of these acts may be skipped depending upon settings. The image information may include, for example, k-space image information. In operation, the process may start during act 150 then proceed to act 151.

During act 151, the process may perform a pre-scan for an initial Sensitivity Map for first image information (e.g., current image information). After completing act 151, the process may continue to act 153.

During act 153, the process may perform a scan such as a T1w image scan (R=1~2) to obtain T1w image information of the first image information. After completing act 153, the process may continue to act 155 and/or act 163.

During act 155, the process may obtain undersampled T1w data corresponding with the first image information. After completing act 155, the process may continue to act 157.

During act 157, the process may perform a PPI reconstruction using imaging methods in accordance with embodiments of the present system (e.g., GRAPPA/SENSE methods) upon the undersampled T1w data to obtain T1w image data 152 corresponding with the first image information. After completing act 157, the process may continue to act 161 and/or 173.

During act 173, the process may perform an information extraction method to obtain information such as structure, sensitivity, etc., from reconstructed images such as (T1w and T2w images).

During act 161, the process may perform an efficient trajectory optimization technique. After completing act 161, the process may continue to act 163.

During act 163, the process may perform a scan such as a T2w image scan (R=4~6) to obtain T2w image information of the second image information. After completing act 163, the process may continue to act 165 and/or act 175.

During act 175, the process may perform a PDW image scan (R=4~6).

During act 165, the process may obtain undersampled T2w data corresponding with the first image information. After completing act 165, the process may continue to act 167.

During act 167, the process may perform a partial image reconstruction using imaging methods in accordance with embodiments of the present system such as a fast PPI imaging method (e.g., using GRAPPA/GROWL) SENSE methods) upon the undersampled T2w data. After completing act 167, the process may continue to act 169.

During act 169, the process may perform an image reconstruction using the undersampled image information obtained during act 167 and the extracted information obtained during act 173 in accordance with imaging methods of embodiments of the present system, such as a CS PPI imaging method to obtain T2W image information 172. After completing act 169, the process may repeat act 151, if desired.

Figure 2:
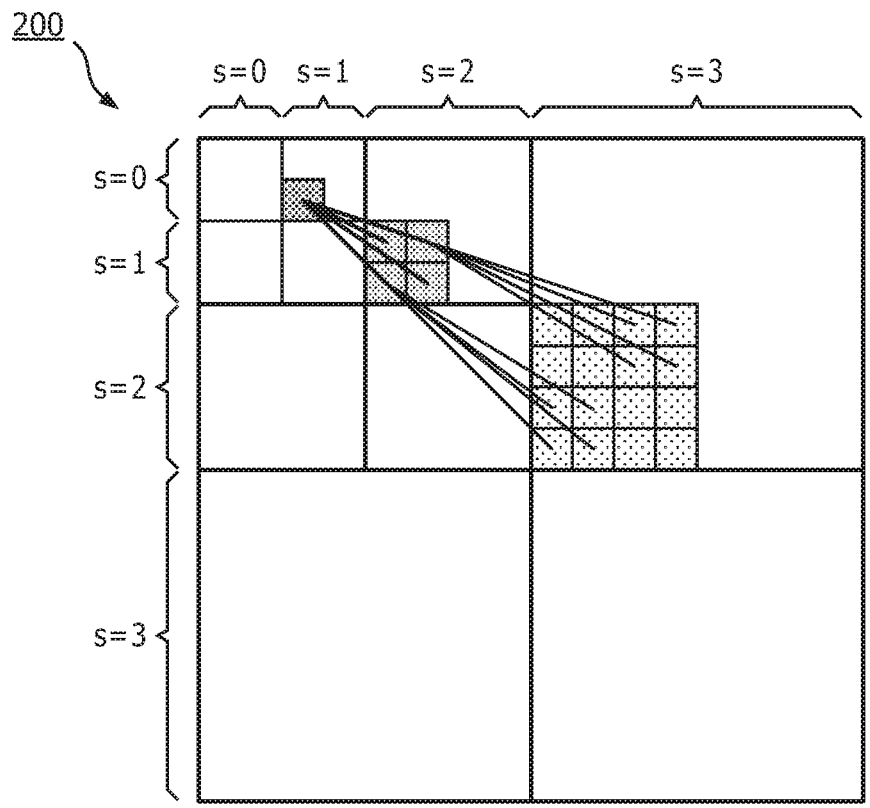
FIG. 2 shows a graph of a wavelet quad-tree in accordance with embodiments of the present system.
Figure 3:
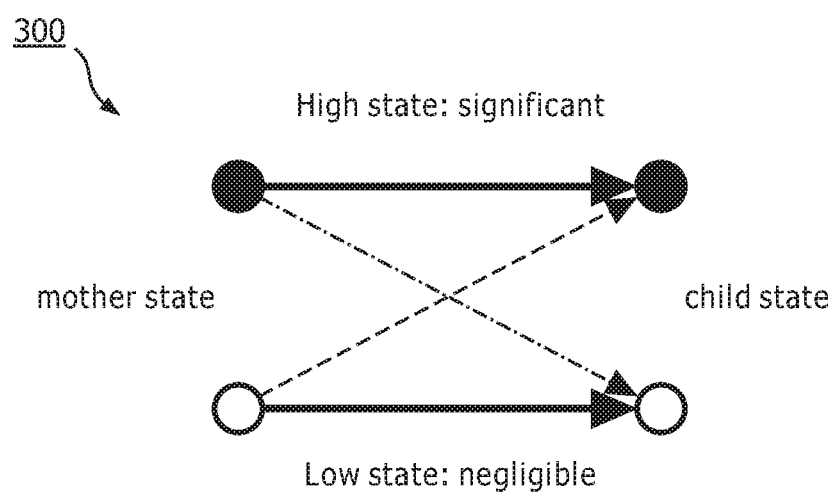
FIG. 3 shows a graph illustrating an HMT model for determining significance in accordance with embodiments of the present system.

FIG. 2 shows a graph of a wavelet quad-tree (WQT also known as a qualified significant wavelet tree (QSWT) in accordance with embodiments of the present system; and FIG. 3 shows a graph illustrating an HMT model for determining significance (e.g., of wavelet coefficients) in accordance with embodiments of the present system. Referring to FIG. 2, in the WQT each (wavelet) coefficient may be connected to four child (wavelet) coefficients. Now, referring to FIG. 3, two hidden states, "Significant" or "Negligible" (e.g., "Non-Significant") of a mother (wavelet) component and one of its daughter (wavelet) components are shown. The transition between the state of these (wavelet) components may be modeled by the HMT.

The HMT may be employed by embodiments of the present system to model the probability density function of each wavelet coefficient as a Gaussian mixture density with a hidden binary state, which in the present embodiments, indicate whether coefficients are "Significant" or "Negligible" (e.g., "Non-Significant"). The properties of 2D wavelet quad-tree may be captured by a Hidden Markov Quad-Tree Model in which the Gaussian mixture distribution and Transition Matrices between states (e.g., see, Equations 5 and 6 below) are functions of several parameters in the wavelet-tree quad tree. The "Significance" of wavelet coefficients shows the structure. Locations with high significance (e.g., "Significant" locations) capture boundaries. Locations with low significance (e.g., "Negligible" locations) tend to capture piecewise constant regions. Thus, the process may analyze the wavelet quad-tree to determine whether a location is "Significant" or not "Significant" (e.g., "Negligible"). The embodiments of the present system jointly estimate the HMT parameters and the hidden state of each (Wavelet) component. Based on measured information in Wavelet domain, the embodiments iteratively estimate the parameters of the HMT to capture the properties of the transform domain and estimate the hidden state of each component that fit the properties best. If it is determined that a location is "Significant," then the process may determine that the location is a boundary location. However, if it is determined that a location captures not "Significant" (e.g., it is "Negligible" or insignificant), then the process may determine that the location captures a piecewise constant region (e.g., it is not a boundary location).

$$f(\theta_n \mid S_n = S) = \mathcal{N}(0, \sigma_{S,n}^2) = \mathcal{N}(0, C_{\sigma_S} 4^{-j\alpha_S}) \quad \text{Eq. (5)}$$
$$f(\theta_n \mid S_n = N) = \mathcal{N}(0, \sigma_{N,n}^2) = \mathcal{N}(0, C_{\sigma_N} 4^{-j\alpha_N})$$

$$A_n = \begin{bmatrix} p_n^{S \to S} & p_n^{S \to N} \\ p_n^{N \to S} & p_n^{N \to N} \end{bmatrix} = \begin{bmatrix} \frac{1}{4} + C_{AS} 4^{-j\gamma_S} & \frac{3}{4} - C_{AS} 4^{-j\gamma_S} \\ C_{AN} 4^{-j\gamma_N} & 1 - C_{AN} 4^{-j\gamma_N} \end{bmatrix} \quad \text{Eq. (6)}$$

Equation 5 demonstrates the mixture Gaussian distribution $f(\theta_n)$ of the value of Wavelet components $\theta_n$ given certain hidden state ($S_n=S$ or $S_n=N$). The distribution is Gaussian $N(0,\sigma^2)$ with zero mean but different variance for different state ($\sigma_{S,n}^2$ "Significance" and $\tau_{N,n}^2$ for "non-significance"). The variance is related to scale j and parameters for two states ($C_{\sigma_S}$, $C_{\sigma_N}$, $\alpha_S$, $\alpha_N$).

Equation 6 demonstrates the transition matrix $A_n$ between two states from mother (Wavelet) component to two states daughter (Wavelet component). There are four types of transition relationships: $p_n^{S \text{ or } N \to S \text{ or } N}$. The transition rate is dependent upon a scale parameter j and parameters for two states ($C_{A_S}$, $C_{A_N}$, $Y_S$, $Y_N$).

The significance is determined based on the estimated probability $p_n^{S \text{ or } N}$ of two states for each (Wavelet) component.

Although the HMT model is used above to extract structure information, it is also envisioned that other methods may be used instead to extract structure information, such as gradient or local mutual information methods (e.g., see, R1, R5, R6, and R9). The HMT model shown and described above is only an example using a wavelet domain model. However, other statistical methods may be used. For example, in accordance with some embodiments statistical methods may be used to regularize with supports constraints in a wavelet domain in images of different contrasts. For example, in some embodiments, rather than extracting information in a wavelet domain (e.g., using the HMT model), the process may extract information in an image space domain and/or in a transformed domain such as a total-variance transform domain (e.g., see, R9).

In accordance with embodiments of the present system, a regularization weight for each (Wavelet) component may be determined using the estimated probability of "Significance". The weight W is inversely proportional to the q-th order of probability $p_n$, as shown in Equation 7 (which is same as Equation 4 and is reproduced below for convenience). $\delta$ may be used for preventing overflow.

$$W_n = (p_n + \delta)^{-q}, \; 1 \leq W_n \leq \delta^{-q}$$

$$W_i = (p_i + \delta)^{-q}, \; 1 \leq W_i \leq \delta^{-q} \quad \text{Eq. (7)}$$

Returning for FIG. 1A, after completing act 107, the process may continue to act 109, during which the process may transform the structure information from the wavelet domain to image space using any suitable reconstruction method.

For example, if the regularization weight is extracted in wavelet domain (as in the present embodiments), a regularization method in the image space domain may be used to perform the reconstruction. Accordingly, the structure information previously obtained (e.g., during act 107) in the wavelet domain can be transformed to the image space domain by using the wavelet coefficients and inverse Wavelet transform. A linear or nonlinear regulation function may be applied to transform the value from statistical weights (e.g., from 0 to 1) to the desired regulation weights. After completing act 109, the process may continue to act 111.

During act 111, the process may extract noise distribution information from the second image data set. The noise distribution information may be embodied as a noise distribution map. Accordingly, the process may calculate a noise distribution map for the second image data set to statistically or analytically calculate a noise distribution information map for the second image data set. To do this, the process may apply the same sampling pattern and parallel image method as applied to the first image. In other words, given the sampling pattern and parallel imaging method for the to-be reconstructed image (e.g., the first image) which is T2w image in the present embodiments, the same sampling pattern and parallel imaging method may be applied to the previously reconstructed image (e.g., the second image data set of the second image) to statistically (e.g., R10) or analytically (e.g., R11) calculate the noise distribution map. After completing act 111, the process may continue to act 113.

During act 113, the process may reconstruct the first image information by applying the extracted image and noise distribution information to the first image information. Accordingly, the process may generate spatially adaptive regularization weights with structure and noise distribution information and, then, reconstruct the first image using these spatially adaptive regularization weights (see, FIG. 4).

A method to generate the spatially adaptive regularization weights with structure and noise distribution information will now be discussed. Assuming "S" represents a calculated "Significance" in the image space, then larger values of S are indicative of a high probability of boundaries being present; and "N" represents the noise distribution map, larger values of N are indicative of higher noise levels after reconstruction. Then the spatially adaptive regularization weights may be defined as shown in Equation 8:

$$\lambda N/S, \quad \text{Eq. (8)}$$

where $\lambda$ is a scaling parameter, S may be based upon a weight W, and N is a noise computed using a previous simulation of noise distribution map.

Then, the process may perform a reconstruction of the first image information in accordance with these spatially adaptive regularization weights and the echo information. Accordingly, the spatially adaptive regularization weights may be applied (e.g., using a point-wise multiplication method) to a regularization term in the reconstruction model to reconstruct the first information. The regularization term can be in the either image space or other transformed mathematical domain. The process may employ any suitable reconstruction algorithms/techniques such as L1-Iterative Self-consistent Parallel Imaging Reconstruction (L1-SPIRiT) and a GeneRalized Auto-calibrating Partially Parallel Acquisitions (GRAPPA) initialization as reconstruction techniques. After completing act 113, the process may continue to act 115.

During act 115, the process may render the reconstructed first image information on, for example, a display of the system so that a user may view the reconstructed first image. The process may further provide a user interface (UI) with which a user may interact to change viewing parameters, etc., enter information (e.g., notes, commands, etc.). The process may process inputs of the user in real time and render corresponding results in real time. After completing act 115, the process may continue to act 117. If it is determined that the data sets has more than 2 images, the process may apply the extracted information to reconstruct the following images. Also, the accuracy of sharable information can be further enhanced by using both the first and the second images after the reconstruction of the second image. The enhanced information can be used for the reconstruction of the third and any other following images.

During act 117, the process may acquire more images and update history information stored in a memory of the system in accordance with image information (e.g., the first image, the second image, etc.), results, etc. of the present process. For example, the process may store information that it uses and/or generates (e.g., results of determinations, MR image information, settings, parameters, etc.) in a memory of the system for later use, analysis, and/or other processing. The information may be stored in association with a name of a corresponding patient, a name of a user (e.g., a professional such as a radiologist), a ROI, etc. Further, in some embodiments, the process may store information determined and/or calculated by the process such as various extracted image information, the transformed image information, etc. for later use. Accordingly, for example, the process may store the reconstructed first image in a memory of the system for later use. After completing act 117, the process may continue to act 119, where it ends.

Experimental Results:

Embodiments of the present system were used to reconstruct a T2w image using a reconstructed T1w image which was used for image extraction (e.g., to obtain structure and noise distribution information). L1-SPIRiT and GRAPPA initialization was employed as a reconstruction technique. Referring back to FIG. 4, graph (A) shows the T1w image used for information extraction; graph (B) shows extracted structure information in the wavelet domain; graphs (C) and (D) each show extracted structure information along x and y dimensions in the image domain; graph (E) shows a reconstruction of the T2w image with 5× acceleration using the extracted information in regularization term. L1-SPIRiT with GRAPPA initialization was used as the reconstruction scheme; and graph (F) shows a reconstructed image (e.g., a T2w image) in accordance with embodiments of the present system.

Accordingly, embodiments of the present system are operative to extract image information which may include structure and noise distribution information from at least one set of previously reconstructed/acquired data sets for images having different contrast(s) than an image to be reconstructed. Further, embodiments of the present system may define spatially adaptive regularization weights in accordance with the extracted information.

Embodiments of the process may explicitly extract structure and noise distribution (hereinafter each of which may be commonly referred to as extracted information) from at least one set of previously reconstructed/acquired data set for images with different contrast(s) (e.g., than an image to be reconstructed). The extracted information can be in image space, or some other transformed domain(s), such as coefficients in a wavelet domain. Further, the previously reconstructed images do not necessarily have the same resolution or be located at the exactly same location as the image to be reconstructed.

The extracted information (e.g., including the extracted structure and noise distribution information) may be used by embodiments of the present system to define spatially adaptive regularization weights for a regularized reconstruction. Regularized reconstruction methods may include one or more imaging methods such as regularized parallel imaging methods, compressed sensing methods, and/or other types of imaging methods. Further, the regularized reconstruction methods may include, for example, an image space method (e.g., in the image space) or a k-space method (e.g., in k-space). The structure information and noise distribution information may be used jointly or independently by the present system to reconstruct the image to be reconstructed. Moreover, the information extraction and application can be iterative among images with different contrasts.

Figure 5:
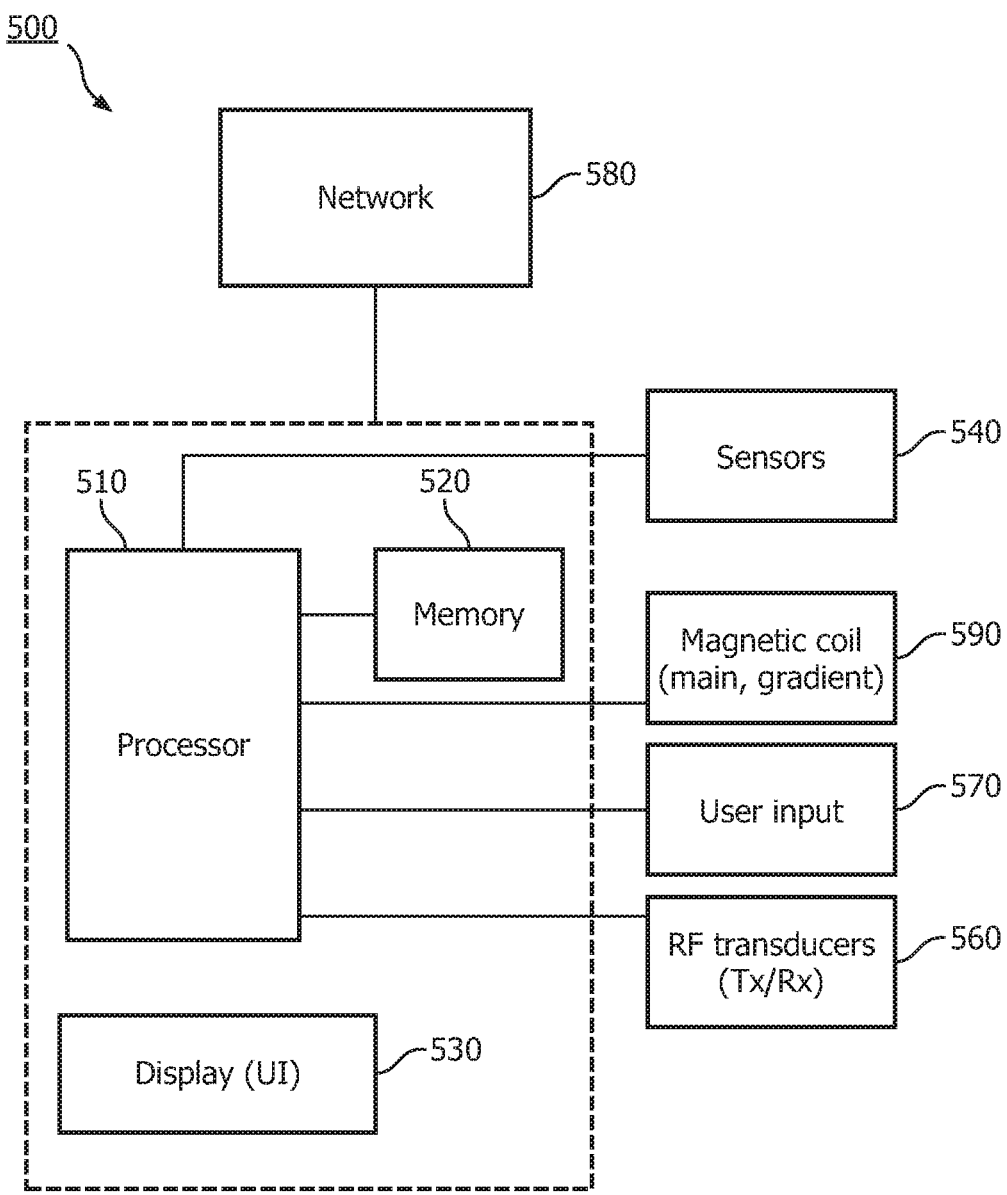
FIG. 5 shows a portion of a system (e.g., peer, server, etc.) in accordance with an embodiment of the present system.

FIG. 5 shows a portion of a system 500 (e.g., peer, server, etc.) in accordance with embodiments of the present system. For example, a portion of the present system may include a processor 510 (e.g., a controller) operationally coupled to a memory 520, a display 530, RF transducers 560, magnetic coils 590, and a user input device 570. The memory 520 may be any type of device for storing application data as well as other data related to the described operation. The application data and other data are received by the processor 510 for configuring (e.g., programming) the processor 510 to perform operation acts in accordance with the present system. The processor 510 so configured becomes a special purpose machine particularly suited for performing in accordance with embodiments of the present system.

The operation acts may include configuring an MRI system by, for example, controlling optional support actuators, the magnetic coils 590, and/or the RF transducers 560. The support actuators may control a physical location (e.g., in x, y, and z axes) of a test subject, if desired. The magnetic coils 590 may include main magnetic coils, and gradient coils (e.g., x-, y-, and z-gradient coils) and may be controlled to emit a main magnetic field and/or gradient fields in a desired direction and/or strength. The controller may control one or more power supplies to provide power to the magnetic coils 590 so that a desired magnetic field is emitted at a desired time. The RF transducers 560 may be controlled to transmit RF pulses at the test subject and/or to receive echo information therefrom. A reconstructor may process received signals such as the echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 530, a speaker, etc. Further, the content may then be stored in a memory of the system such as the memory 520 for later use. Thus, operation acts may include requesting, providing, and/or rendering of content such as, for example, reconstructed image information obtained from the echo information. The processor 510 may render the content such as video information on a UI of the system such as a display of the system.

The user input 570 may include a keyboard, a mouse, a trackball, or other device, such as a touch-sensitive display, which may be stand alone or be a part of a system, such as part of a personal computer, a personal digital assistant (PDA), a mobile phone (e.g., a smart phone), a monitor, a smart- or dumb-terminal or other device for communicating with the processor 510 via any operable link. The user input device 570 may be operable for interacting with the processor 510 including enabling interaction within a UI as described herein. Clearly the processor 510, the memory 520, display 530, and/or user input device 570 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 520 or other memory coupled to the processor 510.

The program and/or program portions contained in the memory 520 may configure the processor 510 to implement the methods, operational acts, and functions disclosed herein. The memories may be distributed, for example between the clients and/or servers, or local, and the processor 510, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 510. With this definition, information accessible through a network is still within the memory, for instance, because the processor 510 may retrieve the information from the network for operation in accordance with the present system.

The processor 510 is operable for providing control signals and/or performing operations in response to input signals from the user input device 570 as well as in response to other devices of a network and executing instructions stored in the memory 520. The processor 510 includes one or more of a microprocessor, an application-specific or general-use integrated circuit(s), a logic device, etc. Further, the processor 510 may be a dedicated processor for performing in accordance with the present system or may be a general-purpose processor wherein only one of many functions operates for performing in accordance with the present system. The processor 510 may operate utilizing a program portion, multiple program segments, or may be a hardware device utilizing a dedicated or multi-purpose integrated circuit.

Figure 6:
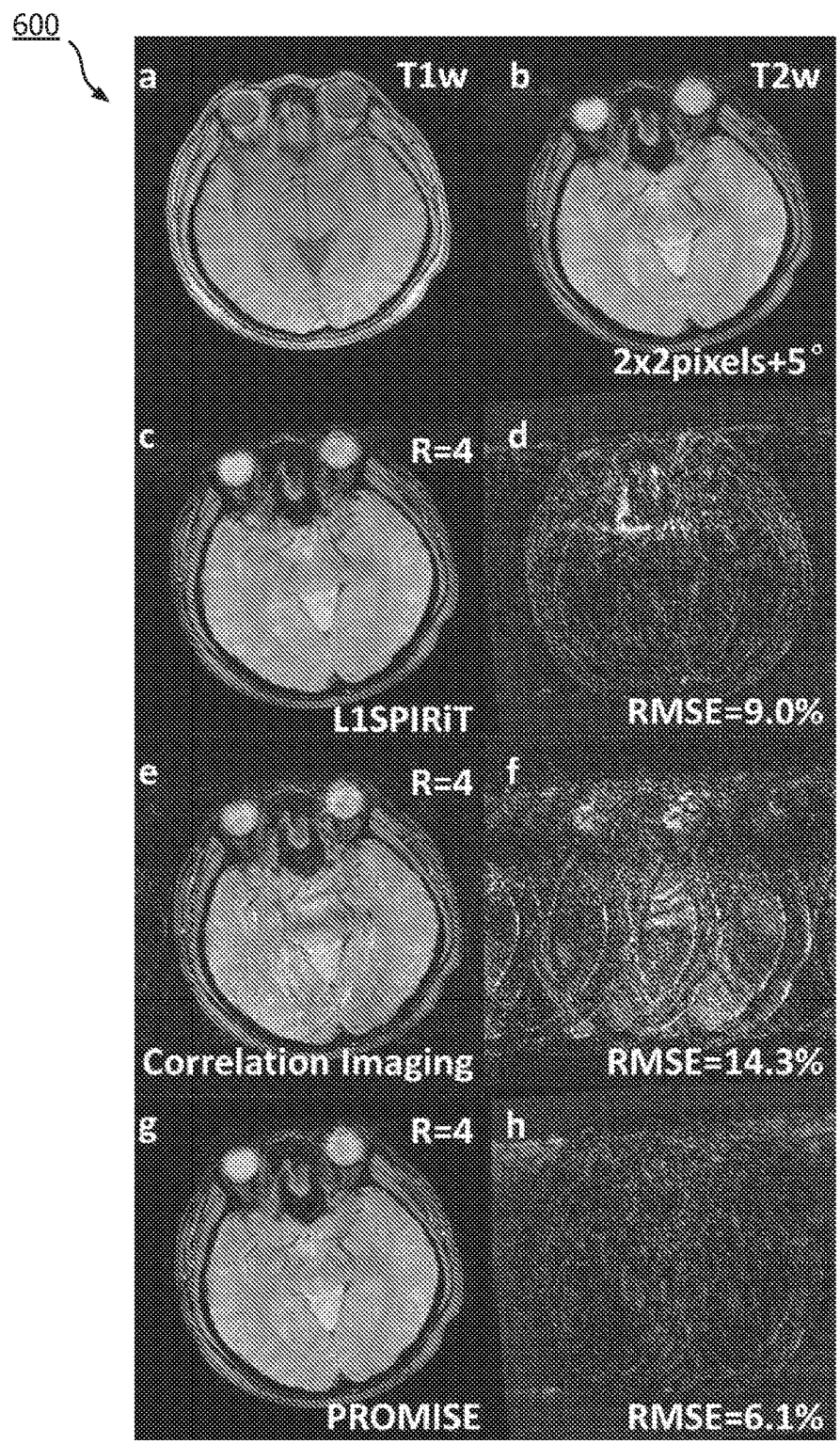
FIGS. 6-7 show graphs of a series of images illustrating comparison of sensitivity to rigid inter-scan motion of a data set in accordance with embodiments of the present system.

FIG. 6 shows a graph 600 of a series of images illustrating comparison of sensitivity to rigid inter-scan motion of a data set in accordance with embodiments of the present system. Comparison of the sensitivity to rigid inter-scan motion (e.g., simulated in-plane motion of data set 1) of L1SPIRiT, Correlation Imaging, and in accordance with an embodiment of the present system based on FIG. 1B are shown. A T1w image and a corresponding translated T2w image are shown in images A and B, respectively. The T2w image was artificially translated by 2 pixels to right and 2 pixels to bottom and rotated by 5 degree counter-clockwise in accordance with embodiments of the present system. An L1-SPIRIT reconstructed image with reduction factor of 4 and a corresponding error map are shown in images C and D, respectively. Images E and F illustrate correlation imaging. Images G and H illustrate imaging in accordance with the embodiment of the present system based on FIG. 1B. Images D, F, and H are error maps corresponding to images C, E, and G, respectively, and are brightened 5 times. Additionally, images D, F, and H include root mean square error (RMSE) in image region of interest (ROI) based upon a reference T2w image.

Figure 7:
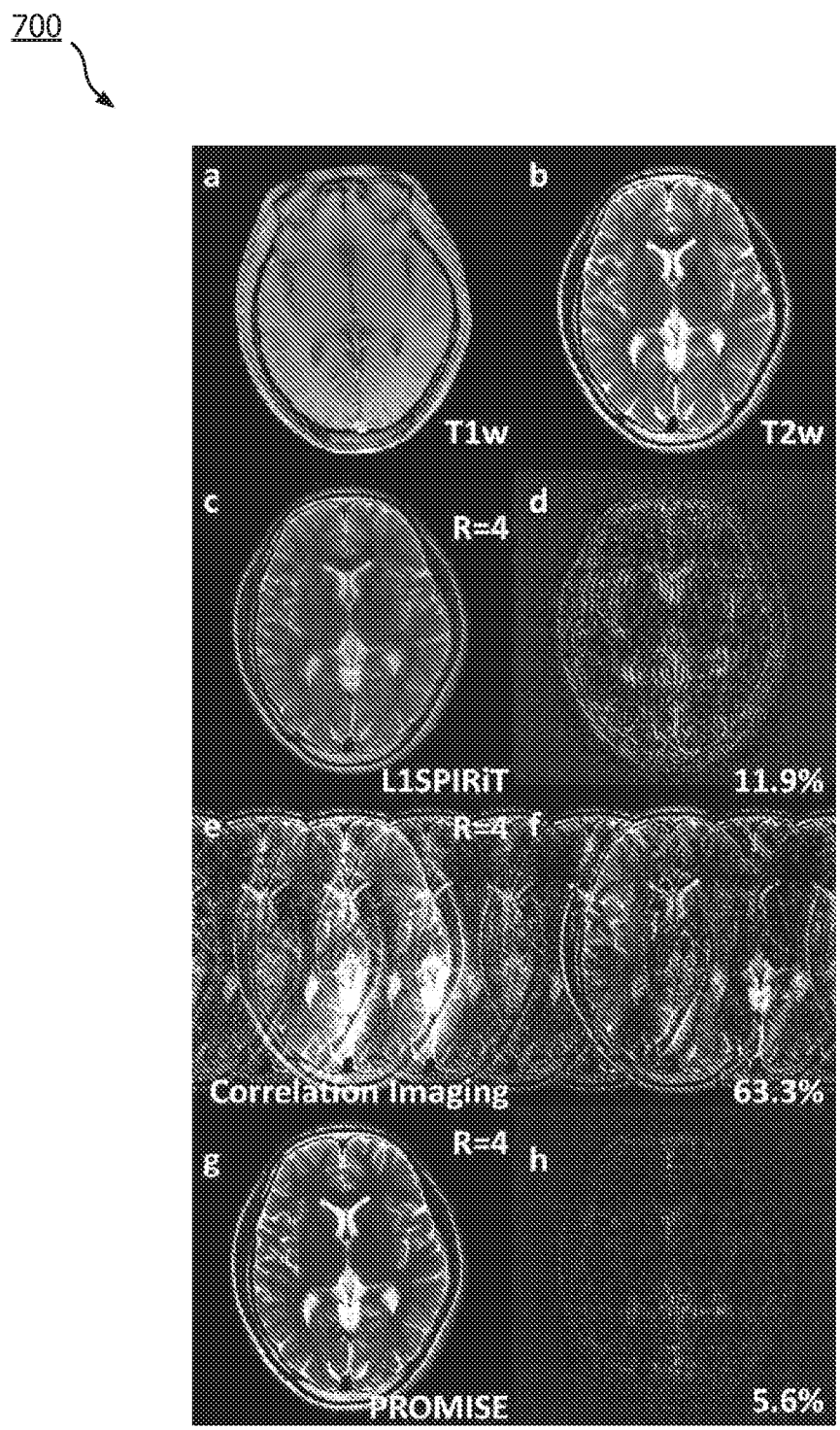

FIG. 7 shows a graph 700 of a series of images illustrating comparison of sensitivity to rigid inter-scan motion of a data set in accordance with embodiments of the present system. Graph 700 illustrates a comparison of sensitivity to rigid inter-scan motion (actual in-plane and out-of plane motions in a second data set) of L1SPIRiT, Correlation Imaging and imaging in accordance with the embodiment of the present system based on FIG. 1B. Images A and B illustrate T1w and T2w images, respectively. Images C and D show a reconstructed image and an error map with a reduction factor of 4 and the corresponding 5-time brightened error map (L1SPRIiT), respectively. Images E and F illustrate correlation imaging. Images G and H illustrate resulting images using the embodiment of the present system based on FIG. 1B. It is seen that conventional correlation imaging methods do not readily solve aliasing due to inter-scan motion. RMSE in the ROI based on a reference T2w image is labeled at the right bottom of each corresponding error-map (e.g., images D, F, and H).

FIG. 8 shows a graph 800 of a series of images illustrating comparison of sensitivity to non-rigid inter-scan motion of a data set (actual in-plane and out-of plane motions in carotid dataset) in accordance with embodiments of the present system. In particular, Graph 800 illustrates a comparison to existing algorithms (L1SPIRiT, Correlation Imaging) and imaging in accordance with the embodiment of the present system based on FIG. 1B for the reconstruction of simulated T2w brain image at net reduction factor of 4. Images A and B illustrate T1w and T2w images with inter-scan motion, respectively. Images C and D shown a reconstructed image and an error map with a reduction factor of 4 and the corresponding 5-time brightened error map (L1SPRIiT), respectively. Images E and F illustrate correlation imaging. Images G and H illustrate images using the embodiment of the present system based on FIG. 1B. RMSE in the ROI based on a reference T2w image is labeled at the right bottom of each corresponding error-map (e.g., images D, F, and H).

FIG. 9 shows a graph 900 of a series of images illustrating comparison of sensitivity to rigid inter-scan motion of a data set in accordance with embodiments of the present system. Graph 900 illustrates a comparison to existing algorithms (L1SPIRiT, Correlation Imaging, and Bayesian based joint-CS) with an embodiment of the present system for the reconstruction of simulated T2w brain image at net reduction factor of 5. Image A shows an image reconstructed with a full k-space; image B shows an image reconstructed using an L1SPIRiT (1D random undersampling) method; image E shows an image reconstructed using a correlation imaging method; image G shows an image reconstructed using a Bayesian-based method in accordance with R1; and image I shows an image reconstructed in accordance with an embodiment of the present system. A square box in image A is an ROI for zooming-in. An optimized sampling trajectory for an image in accordance with the embodiment of the present system based on FIG. 1B is shown in image B. Images D, F, and H are error maps for images C, E, and G, respectively. The error maps were brightened 5 times.

From these images it is seen that images obtained using embodiments of the present system are less sensitive to inter-scan motion due to the usage of shared information in regularization parameter than conventional images. It is seen that embodiments of the present system have greater image quality than conventional methods (c.f., present embodiments and R1).

Embodiments of the present system may provide fast imaging methods to acquire and reconstruct images. Suitable applications may include imaging systems such as magnetic resonance imaging (MRI) systems and the like which require: a short acquisition time, high resolution in given time, and/or reduced motion artifacts.

Further, embodiments of the present system provide a spatially adaptive regularization system which uses structure and noise distribution information from images with different contrasts for the improvement of regularized parallel imaging and to provide reconstructed images.

Thus, images with different contrasts, but acquired at the same location, share significant amount of anatomical and magnetic information. Accordingly, embodiments of the present system may balance noise and artifact level in regularized parallel imaging at high acceleration factors by efficiently using the sharable anatomical information and magnetic information simultaneously For example, boundary and noise distribution information may be extracted from at least one previously reconstructed/acquired image (data set) with a different contrast than an image to be reconstructed. For example, in some embodiments, a statistical wavelet structure obtained by a Hidden Markov tree model may be used to extract structure information. Reconstruction without regularization using the previously reconstructed/acquired data set may be used to extract noise distribution information. Spatially adaptive regularization weight(s) may then be defined with the extracted information for regularized parallel imaging for reconstruction of images with other contrasts than that of the previously reconstructed/acquired image.

Further variations of the present system would readily occur to a person of ordinary skill in the art and are encompassed by the following claims. Through operation of the present system, a virtual environment solicitation is provided to a user to enable simple immersion into a virtual environment and its objects.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

The section headings included herein are intended to facilitate a review but are not intended to limit the scope of the present system. Accordingly, the specification and drawings are to be regarded in an illustrative manner and are not intended to limit the scope of the appended claims.

In interpreting the appended claims, it should be understood that:
a) the word "comprising" does not exclude the presence of other elements or acts than those listed in a given claim;
b) the word "a" or "an" preceding an element does not exclude the presence of a plurality of such elements;
c) any reference signs in the claims do not limit their scope;
d) several "means" may be represented by the same item or hardware or software implemented structure or function;
e) any of the disclosed elements may be comprised of hardware portions (e.g., including discrete and integrated electronic circuitry), software portions (e.g., computer programming), and any combination thereof;
f) hardware portions may be comprised of one or both of analog and digital portions;
g) any of the disclosed devices or portions thereof may be combined together or separated into further portions unless specifically stated otherwise;
h) no specific sequence of acts or steps is intended to be required unless specifically indicated; and
i) the term "plurality of" an element includes two or more of the claimed element, and does not imply any particular range of number of elements; that is, a plurality of elements may be as few as two elements, and may include an immeasurable number of elements.

REFERENCES

References 1-12 listed below are incorporated herein by reference and are referred to using reference numerals R1 through R12, respectively, throughout the specification. For example, R1 may make reference to the first reference (e.g., by Bilgic, B).

1. Bilgic B, Goyal V K, Adalsteinsson E., entitled "Multi-Contrast Reconstruction with Bayesian Compressed Sensing." MagnReson Med 2011; 66(6):1601-1615.
2. Li Y, Dumoulin C., entitled "Correlation Imaging for Multiscan MRI with Parallel Data Acquisition." MagnReson Med 2012; available at http://onlinelibrary.wiley.com/doi/10.1002/mrm.24206/pdf.
3. Huang F, Lin W, Harder Cd, Beck G, Boss C, Duensing G R, Reykowski A., entitled "MRI Using Sharable Information Among Images With Different Contrasts: Motion Compensation." 2012; Melbourne, Australia. p 3435.
4. Huang F, Chen Y, Yin W, Lin W, Ye X, Guo W, Reykowski A., entitled "A Rapid and Robust Method for Sensitivity Encoding with Sparsity Constraints: Self-feeding Sparse SENSE". MagnReson Med 2010; 64(4):1078-1088.
5. Guo W, Huang F., entitled "Local Mutual Information Guided Denoising for Self-Calibrated PPI." 2008; Toronto. p 1289.
6. Akcakaya M, Basha T A, Chan R H, Rayatzadeh H, Kissinger K V, Goddu B, Goepfert L A, Manning W J, Nezafat R., entitled "Accelerated Contrast-Enhanced Whole-Heart Coronary MRI Using Low-Dimensional-Structure Self-Learning and Thresholding." MagnReson Med 2012; 67(5):1434-1443.
7. Crouse M, Nowak R, Baraniuk R., entitled "Wavelet-Based Statistical Signal Processing Using Hidden Markov Models. IEEE Trans Signal Processing." 1998; 46(4):886-902.
8. Duarte M, Wakin M, Baraniuk R., entitled "Wavelet-Domain Compressive Signal Reconstruction Using a Hidden Markov Tree Model." IEEE ICAASP; 2008. p 5137-5140.
9. Guo W, Huang F., entitled "Adaptive Total Variation Based Filtering for MRI Images with Spatially Inhomogeneous Noise and Artifacts." 2009; Boston, USA. p 101-104.
10. Robson P M, Grant A K, Madhuranthakam A J, Lattanzi R, Sodickson D K, McKenzie C A., entitled "Comprehensive Quantification of Signal-to-Noise Ratio and g-Factor for Image-Based and k-Space-Based Parallel Imaging Reconstructions." MagnReson Med 2008; 60:895-907.
11. Pruessmann K P, Weiger M, Scheidegger M B, Boesiger P., entitled "SENSE: Sensitivity encoding for fast MRI. MagnReson." Med 1999; 42:952-962.
12. WO 2012/127341 A1, by Doneva, Mariya Ivanova et al, filed on Feb. 28, 2012 as International Application No. PCT/IB2012/050930, entitled "Compressed Sensing MR Image Reconstruction Using Constraint from Prior Acquisition."

The invention claimed is:

1. A magnetic resonance imaging system, the system comprising a memory and at least one controller coupled to the memory, wherein the at least one controller is configured to:
   acquire echo information of a region of interest, the echo information including first image information suitable for reconstructing at least part of a first image at a selected contrast;
   obtain previously-reconstructed image information of one or more previously-reconstructed images having a different contrast which is different than the selected contrast;
   extract information from the previously-reconstructed image information;
   determine spatially adaptive regularization weights for regularized reconstruction based upon the extracted information; and
   reconstruct the first image information in accordance with the spatially adaptive regularization weights and the echo information,
   wherein the extracted information from the previously-reconstructed image information comprises noise distribution information.

2. The magnetic resonance imaging system of claim 1, wherein the extracted information from the previously-reconstructed image information further includes structure information.

3. The magnetic resonance imaging system of claim 1, wherein the first image information has a first image resolution which is different from a second image resolution of the previously reconstructed images.

4. The magnetic resonance imaging system of claim 1, wherein the at least one controller is configured to select the first image information from one of first or second data sets of first or second image information, respectively, and select the previously reconstructed image information from the other of the first or second data sets wherein the first and second image information have the same field-of-view.

5. The magnetic resonance imaging system of claim 1, wherein the first image information comprises a partially acquired data set.

6. A magnetic resonance imaging system comprising:
   a magnetic resonance imaging (MRI) system including a main magnet coil, gradient coils and RF coils, the MRI system being configured to induce magnetic resonance in tissue of a subject in an imaging region and acquire MRI echo information from a region of interest of the subject;
   one or more processors configured to:
      receive the MRI echo information from a region of interest, the MRI echo information including first image information suitable for reconstructing at least part of a first image of tissue of the subject in the region of interest at a selected contrast,
      obtain previously-reconstructed image information of one or more previously-reconstructed images having a different contrast which is different than the selected contrast,
      extract information including noise distribution information from the previously-reconstructed image information,
      determine spatially adaptive regularization weights for regularized reconstruction based upon the extracted noise distribution information, and
      reconstruct the first image information in accordance with the spatially adaptive regularization weights and the MRI echo information; and
   a display, wherein the one or more processors are configured to render on the display at least one of the reconstructed first image information at the selected contrast and the previously-reconstructed image information having the different contrast which is different than the selected contrast.

7. A method of reconstructing images obtained by a magnetic resonance imaging system, the method performed by at least one controller of the MR magnetic resonance imaging system and comprising acts of:
   acquiring echo information of a region of interest, the echo information including first image information suitable for reconstructing at least part of a first image at a selected contrast;
   obtaining previously-reconstructed image information of one or more previously-reconstructed images having a different contrast which is different from the selected contrast;
   extracting information from the previously-reconstructed image information;
   determining spatially adaptive regularization weights based upon the extracted information; and
   reconstructing the first image information in accordance with the spatially adaptive regularization weights and the echo information,
   wherein the act of extracting information from the previously-reconstructed image information extracts a noise information from the previously-reconstructed image information.

8. The method of claim 7, wherein the act of reconstructing the first image information is performed in accordance with a regularized reconstruction method.

9. The method of claim 7, wherein the act of extracting information from the previously-reconstructed image information further comprises extracting structure information from the previously-reconstructed image information.

10. The method of claim 7, wherein the first image information has a first image resolution that is different from a second image resolution of the previously reconstructed images.

11. The method of claim 7, wherein the first image information comprises a partially acquired data set.

12. The method of claim 7, further comprising an act of rendering, on a display, at least one of the reconstructed first image information at the selected contrast and the previously-reconstructed image information at the different contrast which is different from the selected contrast.

13. A non-transitory computer readable medium comprising a computer program, the computer program comprising instructions which, when executed by a processor, configure the processor to reconstruct images obtained from a magnetic resonance image system, the computer program comprising a program portion configured to:
   acquire echo information of a region of interest, the echo information including first image information suitable for reconstructing at least part of a first image at a selected contrast;
   obtain previously-reconstructed image information of one or more previously-reconstructed images having a different contrast which is different from the selected contrast;
   extract information from the previously-reconstructed image information;

determine spatially adaptive regularization weights for regularized reconstruction based upon the extracted image information; and reconstruct the first image information in accordance with the spatially adaptive regularization weights and the echo information, wherein the program portion for extracting the information from the previously-reconstructed image information is further configured to extract noise information from the previously-reconstructed image information.

14. The non-transitory computer readable medium of claim 13, wherein the program portion is further configured to reconstruct the first image information in accordance with a regularized reconstruction method.

15. The non-transitory computer readable medium of claim 13, wherein the program portion for extracting the information from the previously-reconstructed image information the program portion is further configured to extract structure information from the previously-reconstructed image information.

16. The non-transitory computer readable medium of claim 13, wherein the first image information has a first image resolution that is different from a second image resolution of the previously reconstructed images.

17. The non-transitory computer readable medium of claim 13, wherein when acquiring the echo information of ROI, the program portion is further configured to acquire only a partial data set.

18. The non-transitory computer readable medium claim 13, wherein the program portion is further configured to render, on a display, at least one of the reconstructed first image information at the selected contrast and the previously-reconstructed image information having the different contrast which is different than the selected contrast.

* * * * *